United States Patent
Lee et al.

(10) Patent No.: US 9,212,253 B2
(45) Date of Patent: Dec. 15, 2015

(54) EPOXY RESIN COMPOSITION FOR ENCAPSULATING SEMICONDUCTOR DEVICE AND SEMICONDUCTOR DEVICE USING THE SAME

(75) Inventors: Young Kyun Lee, Seoul (KR); Eun Jung Lee, Incheon (KR); Yoon Kok Park, Gyeonggi-do (KR)

(73) Assignee: CHEIL INDUSTRIES, INC., Gumi-si, Gyeongsangbuk-do (KR)

( * ) Notice: Subject to any disclaimer, the term of this patent is extended or adjusted under 35 U.S.C. 154(b) by 340 days.

(21) Appl. No.: 12/801,851

(22) Filed: Jun. 29, 2010

(65) Prior Publication Data

US 2010/0270664 A1    Oct. 28, 2010

Related U.S. Application Data

(63) Continuation of application No. PCT/KR2008/007434, filed on Dec. 16, 2008.

(30) Foreign Application Priority Data

Dec. 31, 2007 (KR) .................. 10-2007-0141804

(51) Int. Cl.
*C08G 59/38* (2006.01)
*C08G 59/62* (2006.01)
*C08L 63/00* (2006.01)
*C08K 3/36* (2006.01)

(52) U.S. Cl.
CPC .............. *C08G 59/38* (2013.01); *C08G 59/621* (2013.01); *C08L 63/00* (2013.01); *C08K 3/36* (2013.01); *C08K 2201/014* (2013.01); *H01L 2924/0002* (2013.01)

(58) Field of Classification Search
CPC .............. C08L 63/00; C08L 2666/14; H01L 2924/0002; H01L 2924/00; C08G 59/38; C08G 59/621; C08K 2201/014; C08K 3/36
See application file for complete search history.

(56) References Cited

U.S. PATENT DOCUMENTS

| | | | |
|---|---|---|---|
| 3,544,293 A * | 12/1970 | Riebling ..................... | 65/444 |
| 5,298,548 A * | 3/1994 | Shiobara et al. ............. | 523/443 |
| 6,221,509 B1 | 4/2001 | Hirano et al. | |
| 2006/0228561 A1 | 10/2006 | Nakamura | |
| 2007/0281164 A1 | 12/2007 | Osada | |

FOREIGN PATENT DOCUMENTS

| | | |
|---|---|---|
| JP | 58-029858 A | 2/1983 |
| JP | 2001-172472 A | 6/2001 |
| JP | 2007-324358 A | 12/2007 |
| KR | 10-0445252 B1 | 8/2004 |

OTHER PUBLICATIONS

Greenwood, N.N.; Earnshaw, A. (1997). Chemistry of the Elements (2nd Edition). p. 335-346. Elsevier.*
Bansal, Narottam P.; Doremus, R.H. (1986). Handbook of Glass Properties. p. 7-30. Elsevier.*
Downs, R.T., and Palmer, D.C. (1994) The pressure behavior of a cristobalite. American Mineralogist, 79, 9-14.*
English translation of JP 58-029858 (2013).*
Taiwanese Office Action in TW 097150229, dated Jun. 14, 2012 (Lee, et al.).

* cited by examiner

*Primary Examiner* — Callie Shosho
*Assistant Examiner* — John Freeman
(74) *Attorney, Agent, or Firm* — Lee & Morse, P.C.

(57) ABSTRACT

An epoxy resin composition for encapsulating a semiconductor device, the epoxy resin composition including an epoxy resin, a curing agent, and one or more inorganic fillers, the one or more inorganic fillers including prismatic cristobalite, the prismatic cristobalite being present in the epoxy resin composition in an amount of about 1 to about 50% by weight, based on the total weight of the epoxy resin composition.

19 Claims, 3 Drawing Sheets

FIG. 1: Table 2

| Components (wt%) | | Ex. 1 | Ex. 2 | Ex. 3 | Ex. 4 | Ex. 5 | Comp. Ex. 1 | Comp. Ex. 2 | Comp. Ex. 3 | Comp. Ex. 4 |
|---|---|---|---|---|---|---|---|---|---|---|
| Epoxy resin | Phenolaralkyl type epoxy resin[1] | 4.89 | 2.09 | 6.19 | 2.90 | 2.25 | 2.09 | 2.09 | 0.69 | - |
| | Biphenyl type epoxy resin[2] | 2.09 | 4.89 | 0.69 | 6.78 | 0.96 | 4.89 | 4.89 | 6.19 | 2.42 |
| | Cresol novolac type epoxy resin[3] | - | - | - | - | - | - | - | - | 4.54 |
| Curing agent | Phenolaralkyl type phenolic resin[4] | 1.70 | 3.97 | 5.20 | 5.50 | 0.78 | 1.70 | 1.70 | 0.58 | - |
| | Xylok type phenolic resin[5] | 3.97 | 1.70 | 0.58 | 2.36 | 1.82 | 3.97 | 3.97 | 5.20 | 2.28 |
| | Phenol novolac type phenolic resin[6] | - | - | - | - | - | - | - | - | 2.28 |
| Prismatic cristobalite[7] | Average particle diameter 1 μm | 0.13 | 2.15 | 0.64 | 0.41 | 0.93 | 3.00 | - | - | - |
| | Average particle diameter 5 μm | 1.93 | 32.25 | 9.67 | 6.07 | 13.95 | 45.00 | - | - | - |
| | Average particle diameter 18 μm | 0.52 | 8.60 | 2.58 | 1.61 | 3.72 | 12.00 | - | - | - |
| Spherical cristobalite[8] | | - | - | - | - | - | - | - | 12.89 | - |
| Spherical fused silica[9] | | 83.42 | 43.00 | 73.10 | 72.90 | 74.40 | 26.00 | 86.00 | 73.10 | 86.00 |
| Curing accelerator | Triphenylphosphine[10] | 0.30 | 0.30 | 0.30 | 0.42 | 0.14 | 0.30 | 0.30 | 0.30 | 0.33 |
| γ-glycidoxy propyl trimethoxy silane[11] | | 0.50 | 0.50 | 0.50 | 0.50 | 0.50 | 0.50 | 0.50 | 0.50 | 0.50 |
| Carbon black | | 0.30 | 0.30 | 0.30 | 0.30 | 0.30 | 0.30 | 0.30 | 0.30 | 0.30 |
| Carnauba wax | | 0.25 | 0.25 | 0.25 | 0.25 | 0.25 | 0.25 | 0.25 | 0.25 | 0.25 |
| Brominated epoxy resin[12] | | - | - | - | - | - | - | - | - | 0.60 |
| Antimony oxide ($Sb_2O_3$) | | - | - | - | - | - | - | - | - | 0.50 |
| Total | | 100 | 100 | 100 | 100 | 100 | 100 | 100 | 100 | 100 |

Notes: 1) NC-3000, Nippon Kayaku; 2) YX-4000H, Japan Epoxy Resin; 3) EOCN-1020-55, Nippon Kayaku; 4) MEH-7800-4S, Meiwa Kasei; 6) HF-1, Meiwa Kasei; 7) M-4000, Sibelco; 8) CRB-S, Tatzumori; 9) 9:1 mixture of spherical fused silica having an average particle diameter of 20 μm and spherical fused silica having an average particle diameter of 0.5 μm; 10) TPP, Hokko Chemical; 11) KBM-403, Shin Etsu Silicon; 12) ESB-400T, Sumitomo Chemical.

FIG. 2: Table 3

| | | Ex. 1 | Ex. 2 | Ex. 3 | Ex. 4 | Ex. 5 | Comp. Ex. 1 | Comp. Ex. 2 | Comp. Ex. 3 | Comp. Ex. 4 |
|---|---|---|---|---|---|---|---|---|---|---|
| Spiral flow (inch) | | 50 | 41 | 46 | 54 | 38 | 32 | 45 | 51 | 38 |
| Bleed/flash (mm) | | 1.0 | 0.5 | 0.8 | 1.0 | 0.8 | 0.5 | 2.0 | 2.0 | 1.2 |
| Tg (°C) | | 122 | 127 | 124 | 123 | 122 | 129 | 119 | 118 | 148 |
| Flame retardancy | UL 94 | V-0 | V-0 | V-0 | V-0 | V-0 | V-0 | V-0 | V-1 | V-0 |
| Moldability | Number of voids | 0 | 0 | 0 | 0 | 0 | 84 | 0 | 0 | 11 |
| | Number of semiconductor devices tested | 1,000 | 1,000 | 1,000 | 1,000 | 1,000 | 1,000 | 1,000 | 1,000 | 1,000 |
| Warpage | Degree of distortion | 179 | 69 | 125 | 198 | 131 | 55 | 982 | 181 | 547 |
| Reliability | Number of cracks | 0 | 0 | 0 | 0 | 0 | 0 | 5 | 3 | 23 |
| | Number of delamination | 0 | 0 | 0 | 0 | 0 | 31 | 18 | 9 | 33 |
| | Number of semiconductor devices tested | 1,000 | 1,000 | 1,000 | 1,000 | 1,000 | 1,000 | 1,000 | 1,000 | 1,000 |

EPOXY RESIN COMPOSITION FOR ENCAPSULATING SEMICONDUCTOR DEVICE AND SEMICONDUCTOR DEVICE USING THE SAME

CROSS-REFERENCE TO RELATED APPLICATION

This application is a continuation of pending International Application No. PCT/KR2008/007434, entitled "Epoxy Resin Composition for Encapsulating Semiconductor Device and Semiconductor Device Using the Same," which was filed on Dec. 16, 2008 the entire contents of which are hereby incorporated by reference for all purposes.

BACKGROUND

1. Field

Embodiments relate to an epoxy resin composition for encapsulating a semiconductor device and a semiconductor device using the same.

2. Description of the Related Art

Epoxy resins have excellent heat resistance, moisture resistance, electrical characteristics, and adhesion properties, and therefore they have been used for various applications including paints, adhesives, and electrically insulating materials. As methods of encapsulating electronic circuit parts such as semiconductor devices, there have been proposed a hermetic encapsulating method using metals or ceramics, and a resin encapsulating method using phenolic resins, silicone resins, epoxy resins, or the like. The resin encapsulating method using an epoxy resin has been known to be very suitable in view of the balance of economy, productivity, and physical properties.

With recent trends toward reductions in size and weight, and increases in functionalities of electronic devices, there is a remarkably rapid progress in high integration of semiconductors every year. Further, automatic high-density package mounting has recently been promoted in the step of mounting parts to a semiconductor mounting board, and a "surface mounting" in which a semiconductor package is directly soldered to the surface of the board has been frequently employed in place of the conventional "insertion mounting" in which lead pins are inserted into holes of a board. Packages are correspondingly in a transition from conventional dual inline package (DIP) to thin-type flat plastic package (FPP) suitable for high-density surface mounting. Further, the packages are developed to meet the demands of large sizes and high pin counts, as an occupying area of semiconductor chips in the package is increased due to improved microprocessing technology, i.e., improved integration of semiconductors.

In order to keep pace with the requirement of high pin counts for high integration of the semiconductor device, there has been active research on an area-mounting type semiconductor device where a package-mounting side of a board is largely resin-encapsulated, representatively Ball Grid Array (BGA) and Chip Size Package (CSP) semiconductor package structures (for example, SOP or QFP type package). This structure is configured by mounting adhesive layers and semiconductor devices on a resin board (hard printed circuit board or film printed circuit board), followed by resin encapsulation, generally resulting in an asymmetric one-sided encapsulation structure of the semiconductor device.

SUMMARY

It is a feature of an embodiment to provide an epoxy resin composition for encapsulation of semiconductor devices, the composition being useful for manufacture of semiconductor devices having high flame retardancy and excellent moldability, workability, warp resistance, and reliability.

It is another feature of an embodiment to provide an epoxy resin composition for encapsulating a semiconductor device which is capable of securing excellent flame retardancy without use of halogen-based flame retardants and phosphorus-based flame retardants harmful to the human body or devices of interest, and is capable of alleviating or reducing warpage of a semiconductor package having an asymmetric one-sided encapsulation structure while simultaneously providing excellent workability, moldability, and package reliability.

At least one of the above and other features and advantages may be realized by providing an epoxy resin composition for encapsulating a semiconductor device, the epoxy resin composition including an epoxy resin, a curing agent, and one or more inorganic fillers, the one or more inorganic fillers including prismatic cristobalite, the prismatic cristobalite being present in the epoxy resin composition in an amount of about 1 to about 50% by weight, based on the total weight of the epoxy resin composition.

The prismatic cristobalite may have an average particle diameter of 0.1 to 35 μm, wherein a proportion of particles having a particle diameter ranging from 45 to 75 μm is 0.1 to 50% by weight, based on the total weight of the prismatic cristobalite.

The prismatic cristobalite may be a mixture of 1 to 20% by weight of prismatic cristobalite having an average particle diameter of 0.1 to 3 μm, 30 to 90% by weight of prismatic cristobalite having an average particle diameter of 3 to 10 μm, and 5 to 60% by weight of prismatic cristobalite having an average particle diameter of 10 to 20 μm.

The inorganic filler, including the prismatic cristobalite, may be present in the epoxy resin composition in an amount of about 72 to about 95% by weight, based on the total weight of the epoxy resin composition.

The epoxy resin may include:
a phenolaralkyl type epoxy resin represented by Formula 1:

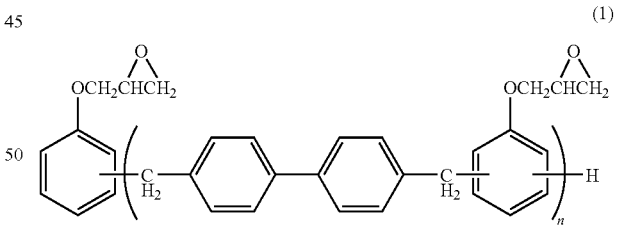

(1)

wherein n is an average of 1 to 7; or
a biphenyl type epoxy resin represented by Formula 2:

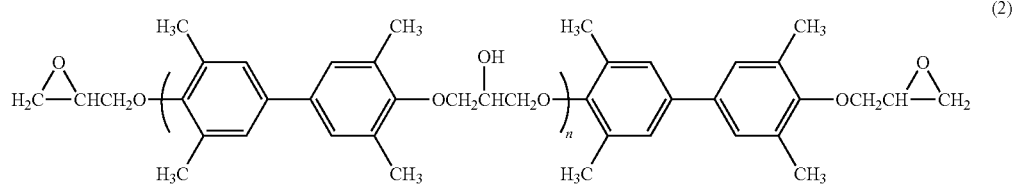

(2)

wherein n is an average of 0 to 7.

The epoxy resin may include the phenolaralkyl type epoxy resin represented by Formula 1, and the phenolaralkyl type epoxy resin of Formula 1 may be present in the epoxy resin about 10 to about 85% by weight, based on the total weight of the epoxy resin.

The epoxy resin may be present in the epoxy resin composition in an amount of about 2 to about 15% by weight, based on the total weight of the epoxy resin composition.

The curing agent may include:

a phenolaralkyl type phenolic resin represented by Formula 3:

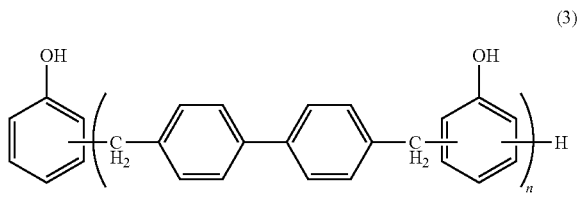

wherein n is an average of 1 to 7; or
a xylok type phenolic resin represented by Formula 4:

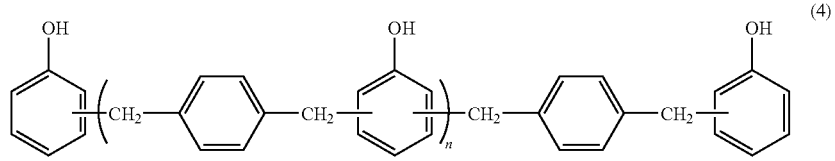

wherein n is an average of 0 to 7.

The curing agent may include the phenolaralkyl type phenolic resin represented by Formula 3, and the phenolaralkyl type phenolic resin of Formula 3 may be present in the curing agent in an amount of about 10 to about 85% by weight, based on the total weight of the curing agent.

The curing agent may be present in the epoxy resin composition in an amount of about 0.5 to about 12% by weight, based on the total weight of the epoxy resin composition.

The epoxy resin composition may further include a curing accelerator, the curing accelerator being present in the epoxy resin composition in an amount of about 0.001 to about 1.5% by weight, based on the total weight of the epoxy resin composition.

At least one of the above and other features and advantages may also be realized by providing a semiconductor device encapsulated by a final powder product which is prepared by mixing the composition according to an embodiment using a Henshel or Redige mixer, melt-kneading the mixture in a roll mill or kneader, and cooling and pulverizing the mixture into a powder form.

The semiconductor device may be encapsulated with the final powder product by low-pressure transfer molding, injection molding, or casting.

The semiconductor device may include a copper-based lead frame, an iron-based lead frame, a nickel-palladium-plated copper- or iron-based lead frame, or an organic-based laminate frame.

At least one of the above and other features and advantages may also be realized by providing an electronic device, including a semiconductor device, a semiconductor mounting board, the semiconductor device being surface mounted to the semiconductor mounting board, and an encapsulant covering the semiconductor device on the semiconductor mounting board, the encapsulant including a cured mixture of an epoxy resin, a curing agent, and one or more inorganic fillers, the one or more inorganic fillers including prismatic cristobalite, the prismatic cristobalite being present in the epoxy resin composition in an amount of about 1 to about 50% by weight, based on the total weight of the epoxy resin composition.

The semiconductor device may be mounted to the semiconductor mounting board by an array of electrical joints disposed underneath the semiconductor device.

The array of electrical joints may be a ball grid array.

The electronic device may further include an adhesive layer between the semiconductor device and the semiconductor mounting board, the adhesive layer having a different composition than that of the encapsulant.

The encapsulant may not be disposed between the semiconductor device and the semiconductor mounting board.

At least one of the above and other features and advantages may also be realized by providing a method of fabricating an electronic device that includes a semiconductor mounting board and a semiconductor device, the method including mounting the semiconductor device to the semiconductor mounting board, and, subsequently, encapsulating the semiconductor device using an epoxy resin composition, the epoxy resin composition including an epoxy resin, a curing agent, and one or more inorganic fillers, the one or more inorganic fillers including prismatic cristobalite, the prismatic cristobalite being present in the epoxy resin composition in an amount of about 1 to about 50% by weight, based on the total weight of the epoxy resin composition.

BRIEF DESCRIPTION OF THE DRAWINGS

The above and other features and advantages will become more apparent to those of skill in the art by describing in detail example embodiments with reference to the attached drawings, in which:

FIG. 1 illustrates Table 2;
FIG. 2 illustrates Table 3.

DETAILED DESCRIPTION

Figure 3:
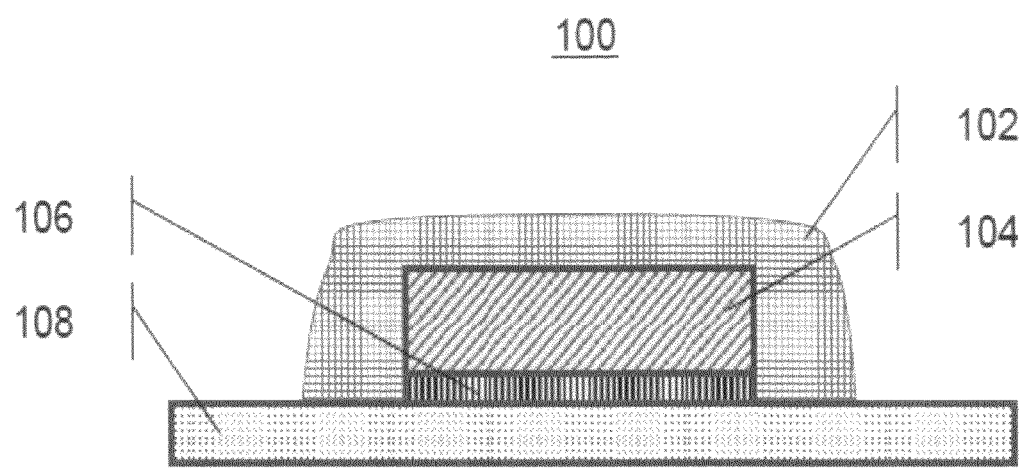
FIG. 3 illustrates an electronic device according to an embodiment.

Korean Patent Application No. 10-2007-0141804, filed on Dec. 31, 2007, in the Korean Intellectual Property Office, and entitled: "Epoxy Resin Composition for Encapsulating Semiconductor Device and Semiconductor Device Using the Same," is incorporated by reference herein in its entirety.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout An embodiment relates to an epoxy resin composition for encapsulating a semiconductor device, the epoxy resin composition including an epoxy resin, a curing agent, and one or more inorganic fillers. The one or more inorganic fillers may include prismatic cristobalite as one of the inorganic fillers. Another embodiment relates to a semiconductor device using the same.

The one or more inorganic fillers may provide a reduction of stress and may improve mechanical properties of the epoxy resin composition. Examples of the fillers may be used with the prismatic cristobalite include fused silica, crystalline silica, calcium carbonate, magnesium carbonate, alumina, magnesia, clay, talc, calcium silicate, titanium oxide, antimony oxide, glass fiber, and a combination thereof. Fused silica, for example, may be a preferred epoxy resin composition filler to provide low-stress properties thereto due to its low coefficient of linear expansion. The fused silica may refer to amorphous silica having a true specific gravity of about 2.3 or less. The amorphous silica may be prepared by melting crystalline silica or by synthesis from various raw materials.

Prismatic cristobalite as one of the inorganic fillers is preferably used in an amount of about 1 to about 50% by weight, based on the total weight of the epoxy resin composition. Maintaining the content of the prismatic cristobalite at about 1% by weight or more, based on the total weight of the epoxy resin composition, may help ensure desirable reductions in warpage of a package, and may also help provide an epoxy resin composition for encapsulating a semiconductor device having excellent workability, moldability, and reliability. Maintaining the content of the prismatic cristobalite at about 50% by weight or less, based on the total weight of the epoxy resin composition, may help avoid deteriorating the fluidity of the epoxy resin composition, avoid defects of moldability, and ensure package reliability. A content of the prismatic cristobalite is more preferably 2 to 40% by weight, and most preferably 3 to 30% by weight, based on the total weight of the epoxy resin composition.

In the present embodiment, the total content of the inorganic filler (i.e., including the prismatic cristobalite) is preferably about 72 to about 95% by weight, more preferably 80 to 93% by weight, based on the total weight of the epoxy resin composition. This may provide a desirable balance between the flame retardancy and reliability and the fluidity of the resin composition.

The prismatic cristobalite may have an average particle diameter of 0.1 to 35 μm. Preferably, the prismatic cristobalite has an average particle diameter of 0.1 to 35 μm, wherein a proportion of particles having a particle diameter ranging from 45 to 75 μm is adjusted to 0.1 to 50% by weight. More preferably, the prismatic cristobalite is used as a mixture of 1 to 20% by weight of prismatic cristobalite having an average particle diameter of 0.1 to 3 μm, 30 to 90% by weight of prismatic cristobalite having an average particle diameter of 3 to 10 μm, and 5 to 60% by weight of prismatic cristobalite having an average particle diameter 10 to 20 μm.

The prismatic cristobalite may be surface-treated with a coupling agent such as epoxy silane, aminosilane, alkylsilane, mercaptosilane, alkoxysilane, and so forth, prior to use thereof.

Coefficients of thermal expansion (C.T.E.) for the cristobalite, spherical fused silica, and organic-based laminate frames used as a printed circuit board are given in Table 1 below. The cristobalite is a kind of silicate mineral and is composed of the chemistry $SiO_2$. The cristobalite is a polymorph of quartz and tridymite.

TABLE 1

| Materials | C.T.E. ($\alpha 1$, ppm/° C.) |
| --- | --- |
| Cristobalite | 12-14 |
| Spherical fused silica | 5 |
| Organic-based laminate frame | 17-20 |

Generally, in view of the C.T.E.s in Table 1, a non-halogen flame retardant epoxy resin composition prepared by high filling of spherical fused silica into the epoxy resin and curing agent may suffer from significant warpage when used for an asymmetric one-sided molding structure, due to a large difference in the coefficient of thermal expansion between the spherical fused silica and the organic-based laminate frame. Thus, such an asymmetric one-sided molding structure may suffer from deterioration of reliability due to increased thermal stress resulting from differences in thermal behavior between individual materials. In contrast, the present embodiment employs prismatic cristobalite and may reduce differences in the coefficient of thermal expansion with the organic-based laminate frame, thus alleviating a warpage phenomenon, and simultaneously may increase crack-resistant properties due to morphological characteristics of a prismatic structure.

While not being bound by theory, it is believed that a reduction in warpage may be achieved due to the prismatic cristobalite having a long propagation path of cracks, thus delaying the propagation of cracks, whereas spherical cristobalite has a short propagation path of cracks from the inside of a package to the outside. Further, the prismatic cristobalite has a specific surface area larger than the spherical cristobalite, and is therefore advantageous in terms of workability due to shortened burrs of resin bleed or flash. That is, when the bleed or flash is lengthened, an air vent of the package may be blocked by the cured bleed or flash, which may result in incomplete molding or a shortened cleaning cycle, thus probably causing poor productivity.

The epoxy resin of the present embodiment is preferably an epoxy resin conventionally used for semiconductor encapsulation. The epoxy resin is preferably an epoxy compound containing two or more epoxy groups in the molecular structure thereof. Examples of the epoxy resins may include epoxy resins obtained by epoxidation of a condensation product of phenol or alkyl phenol with hydroxybenzaldehyde, phenol novolac type epoxy resins, cresol novolac type epoxy resins, phenolaralkyl type epoxy resins, biphenyl type epoxy resins, multifunctional epoxy resins, naphthol/novolac type epoxy resins, novolac type epoxy resins of bisphenol A/bisphenol F/bisphenol AD, glycidyl ether of bisphenol A/bisphenol F/bisphenol AD, bishydroxybiphenyl-based epoxy resins, dicyclopentadiene-based epoxy resins, and the like. Particularly preferable epoxy resins may be phenolaralkyl type epoxy resins of novolac structure containing, in the molecule, a biphenyl derivative and represented by Formula 1 or biphenyl type epoxy resins represented by Formula 2. These epoxy resins may be used alone or in any combination thereof. Further, there may also be used adducts of these epoxy resins, like a melt master batch (MMB), obtained by the reaction with other components such as a curing agent, a curing accelerator, a reaction modifier, a release agent, a coupling agent, a stress-reducing agent, and the like. In an implementation, the epoxy resin composition may include one or more epoxy resins.

As discussed above, particularly preferable epoxy resins may be phenolaralkyl type epoxy resins of novolac structure containing a biphenyl derivative in the molecule, and represented by Formula 1, or biphenyl type epoxy resins represented by Formula 2:

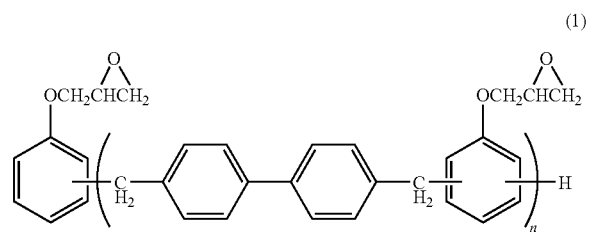

wherein n is an average of 1 to 7.

A content of the epoxy resin to be used is preferably about 2 to about 15% by weight, more preferably 3 to 12% by weight, based on the total weight of the epoxy resin composition. The phenolaralkyl type epoxy resin is preferably used in an amount of about 10 to about 85% by weight, based on the total weight of the epoxy resin. Further, the biphenyl type epoxy resin of Formula 2 is preferable from the viewpoint of enhancing fluidity and reliability of the resin composition.

The curing agent of the present embodiment is preferably a curing agent conventionally used for the encapsulation of semiconductors and contains two or more reactive groups. Specific examples of the curing agents may include phenolaralkyl type phenolic resins, phenol novolac type phenolic resins, xylok type phenolic resins, cresol novolac type phenolic resins, naphthol type phenolic resins, terpene type phenolic resins, multifunctional phenolic resins, dicyclopentadiene-based phenolic resins, novolac type phenolic resins synthesized from bisphenol A and resol, polyhydric phenolic compounds, e.g., tris(hydroxyphenyl)methane, dihydroxybiphenyl; acid anhydrides, e.g., maleic anhydride, phthalic anhydride, and so forth; and aromatic amines, e.g., meta-phenylenediamine, diaminodiphenylmethane, diaminodiphenylsulfone, and so forth. Particularly preferable curing agents may be phenolaralkyl type phenolic resins of novolac structure containing, in the molecule, a biphenyl derivative and represented by Formula 3 or xylok type phenolic resins represented by Formula 4. These curing agents may be used alone or in any combination thereof. Further, there may also be used adducts of these curing agents, like a melt master batch (MMB), obtained by the reaction with other components such as an epoxy resin, a curing accelerator, a reaction modifier, a release agent, a coupling agent, a stress-reducing agent, and the like. In an implementation, the epoxy resin composition may include one or more curing agents.

As discussed above, particularly preferable curing agents may be phenolaralkyl type phenolic resins of novolac structure containing a biphenyl derivative in the molecule, and represented by Formula 3, or xylok type phenolic resins represented by Formula 4:

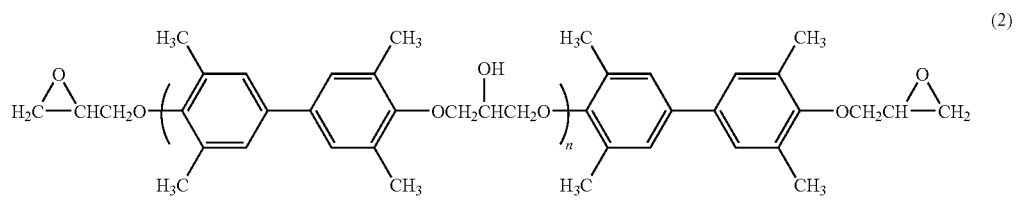

wherein n is an average of 0 to 7.

The phenolaralkyl type epoxy resin of Formula 1 has a phenolic backbone and contains biphenyl at the middle of the molecular structure. Due to such structural characteristics, the epoxy resin of Formula 1 advantageously exhibits excellent hygroscopicity, toughness, oxidation resistance and crack-resistance, and a low crosslinking density which consequently provides some flame retardancy through the formation of a carbon layer (char) upon combustion at a high temperature.

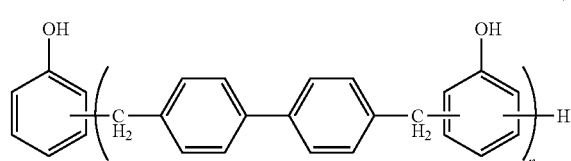

wherein n is an average of 1 to 7.

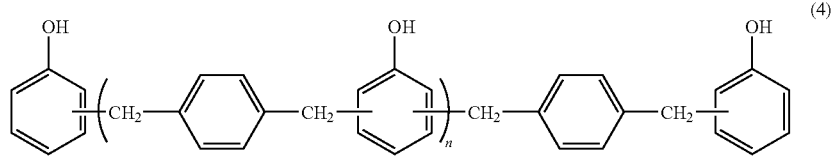

wherein n is an average of 0 to 7.

The phenolaralkyl type phenolic resin of Formula 3 achieves flame retardancy through the blockage of transfer of ambient heat and oxygen upon combustion thereof. The phenolaralkyl type phenolic resin is preferably used in an amount of about 10 to about 85% by weight, based on the total weight of the curing agent. Further, the xylok type phenolic resin of Formula 4 is preferable from the viewpoint of enhancing fluidity and reliability of the resin composition.

A content of the curing agent to be used is preferably about 0.5 to about 12%, more preferably 1 to 8% by weight, based on the total weight of the epoxy resin composition. The chemical equivalent ratio of the epoxy resin to the curing agent in the epoxy resin composition is preferably 0.5 to 2 and more preferably 0.8 to 1.6, with respect to required mechanical properties and moisture resistance reliability of the package.

An epoxy resin composition according to an embodiment further includes a curing accelerator. The curing accelerator is a material that promotes a reaction between the epoxy resin and the curing agent. Suitable curing accelerators may include tertiary amines, organometallic compounds, organic phosphorus compounds, imidazole compounds, boron compounds, and combinations thereof. Examples of the tertiary amines may include benzyldimethylamine, triethanolamine, triethylenediamine, diethylaminoethanol, tri(dimethylaminomethyl)phenol, 2-2-(dimethylaminomethyl)phenol, 2,4,6-tris(diaminomethyl)phenol, salts of tri-2-ethylhexanoic acid, and so forth. Examples of the organometallic compounds may include chromium acetylacetonate, zinc acetylacetonate, nickel acetylacetonate, and so forth. Examples of the organic phosphorus compounds may include tris-4-methoxyphosphine, tetrabutylphosphonium bromide, butyltriphenylphosphonium bromide, phenylphosphine, diphenylphosphine, triphenylphosphine, triphenylphosphine triphenylborane, triphenyl-phosphine-1,4-benzoquinone adducts, and so forth. Examples of the imidazole compounds may include 2-methylimidazole, 2-phenylimidazole, 2-aminoimidazole, 2-methyl-1-vinylimidazole, 2-ethyl-4-methylimidazole, 2-heptadecylimidazole, and so forth. Examples of the boron compounds may include tetraphenylphosphonium-tetraphenylborate, triphenylphosphine tetraphenylborate, tetraphenylboron salt, trifluoroborane-n-hexylamine, trifluoroborane monoethylamine, tetrafluoroborane triethylamine, tetrafluoroborane amine, and so forth. In addition, there may be used salts of 1,5-diazabicyclo[4.3.0]non-5-ene (DBN), 1,8-diazabicyclo[5.4.0]undec-7-ene (DBU) and phenol novolac resin salts. Particularly preferred are organic phosphorus-, amine- or imidazole-based curing accelerators, which may be used alone or in any combination thereof. The curing accelerator may also be an adduct obtained from a reaction with the epoxy resin or curing agent.

In an embodiment, the amount of the curing accelerator used is preferably about 0.001 to about 1.5% by weight, and more preferably 0.01 to 1% by weight, based on the total weight of the epoxy resin composition.

The epoxy resin composition of the present invention may also include one or more additives. Examples of the additive may include release agents, such as higher fatty acids, higher fatty acid metal salts, naturally-occurring fatty acids, paraffin type waxes, ethylene type waxes, ester type waxes, and so forth; colorants, such as carbon black, organic dyes, inorganic dyes, and so forth; coupling agents, such as epoxy silane, aminosilane, mercaptosilane, alkylsilane, alkoxysilane, and so forth; and stress-reducing agents, e.g., modified silicone oils, silicone powders, silicone resins, and so forth. The modified silicone oil may be preferably a silicone polymer having excellent heat resistance. For example, a silicone oil having an epoxy functional group, a silicone oil having an amine functional group, a silicone oil having a carboxyl functional group, or a mixture thereof may be used in an amount of 0.01 to 2% by weight, based on the total weight of the epoxy resin composition.

The epoxy resin composition according to an embodiment may be prepared by using the above-mentioned components in accordance with the following general procedure. First, respective predetermined amounts of the components may be homogeneously and sufficiently mixed using a mixer, e.g., a Henshel or Redige mixer. Next, the mixture may be melt-kneaded (e.g., in a roll mill or a kneader), cooled, and pulverized into a powder form. Low-pressure transfer molding, injection molding, or casting may be employed to encapsulate a semiconductor device using the epoxy resin composition of the present invention. According to the aforesaid method, it may be possible to manufacture semiconductor devices of copper-based lead frames, iron-based lead frames, nickel-palladium-plated copper- or iron-based lead frames, and organic-based laminate frames.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

EXAMPLES 1 TO 5 AND COMPARATIVE EXAMPLES 1 TO 4

Sample epoxy resin compositions 1-5 according to an embodiment, and comparative epoxy resin compositions 1-4, were prepared in accordance with Table 2 in FIG. 1. The respective components were homogenously mixed using a Henshel mixer, melt-kneaded at 100 to 120° C. using a twin screw kneader, cooled, and pulverized to prepare epoxy resin compositions for semiconductor molding. The physical properties of each epoxy resin composition were evaluated as follows. The test results are given in Table 3 in FIG. 2.

Fluidity (flow length): Fluidity of each composition was evaluated by measuring a spiral flow length of the composition using a transfer molding press at 175° C. and 70 Kgf/cm², according to the standard procedure of EMMI-1-66. A higher value represents greater fluidity.

Glass transition temperature (Tg): Tg was measured using a Thermo-Mechanical Analyzer (TMA).

Flame retardancy: Flame retardancy was evaluated for a sample thickness of ⅛", according to the standard test method of UL 94 V-0.

Moldability: The epoxy resin compositions of Tables 1 and 2 were molded to prepare a ball grid array (BGA) package (44 mm×44 mm×0.9 mm) by transfer molding at 175° C. for 70 sec, using a Multi Plunger System (MPS). The package was post-cured at 175° C. for 2 hours and then cooled to room temperature. Thereafter, voids observed on a surface of the package were counted by naked eyes.

Evaluation of warpage: Using a non-contact laser measuring system for the BGA package prepared to evaluate the moldability, height differences from the ground were measured at diagonal center and ends of an upper surface of the package.

Evaluation of reliability: Following the evaluation of warpage properties, the BGA package was dried at 125° C. for 24 hours, 5 cycles of a thermal shock test were performed (1 cycle refers to that the package is allowed to stand at −65° C. for 10 min, 25° C. for 5 min, and at 150° C. for 10 min). Thereafter, the package was subjected to preconditioning. That is, the package was allowed to stand at 60° C. and RH of 60% for 120 hours, and then passed through one IR reflow test at 260° C. for 30 sec. This preconditioning was repeated three times. Using a non-destructive test, e.g. C-mode Scanning Acoustic Microscopy (C-SAM), the occurrence of delamination was evaluated between epoxy resin compositions and lead frames and chips.

From the results of Table 3 in FIG. 2, it can be seen that the epoxy resin compositions according to embodiments exhibit excellent flame retardancy without use of halogen-based flame retardants, and can be used for manufacture of semiconductor devices having excellent moldability and workability upon packaging thereof, and having excellent warpage properties and reliability of a semiconductor package after packaging thereof.

FIG. 3 illustrates an electronic device 100 according to an embodiment. The electronic device 100 may include a semiconductor device 104, which may be, e.g., a bare die. The electronic device 100 may also include a semiconductor mounting board 108, which may be, e.g., a resin board, a hard printed circuit board, a film printed circuit board, an organic resin-based printed circuit board, etc. The semiconductor device 104 may be surface mounted to the semiconductor mounting board 108. An encapsulant 102 according to an embodiment may cover the semiconductor device 104 on the semiconductor mounting board 108. The semiconductor device 104 may be mounted to the semiconductor mounting board 108 by, e.g., an array of electrical joints disposed underneath the semiconductor device 104. The array of electrical joints may be within an area defined by a periphery of the semiconductor device 104, e.g., directly beneath a die active area. The semiconductor device 104 may be mounted to the semiconductor mounting board 108 by, e.g., a ball grid array, etc. The electronic device 100 may further include an adhesive layer 106 between the semiconductor device 104 and the semiconductor mounting board 108. The electronic device 100 may have an asymmetric package, e.g., the encapsulant may not be present between the semiconductor device 104 and the semiconductor mounting board 108. In an embodiment, a method of fabricating the electronic device 100 may include mounting the semiconductor device 104 to the semiconductor mounting board 108 with the adhesive layer 106 therebetween and, subsequently, encapsulating the semiconductor device 104 may covering it with an epoxy resin composition according to an embodiment.

A general asymmetric one-sided encapsulation structure of a semiconductor device may disadvantageously suffer from the occurrence of warpage throughout the semiconductor device after resin molding, due to different coefficients of thermal expansion between individual members of the structure. Products of a thin package structure where a thickness of a resin encapsulated in the semiconductor device is less than 0.8 mm are particularly susceptible to deformation. This is because an absolute amount of an epoxy encapsulation resin to be used is decreased, thereby resulting in significant susceptibility to other members. To this end, there has been a need for development of an epoxy resin composition capable of exhibiting excellent warpage properties even in such a thin package structure. With recent prevalence of a Mold Array Package (MAP) molding method involving molding of an epoxy resin composition in one batch and subsequent separation of individual packages, for improvements of productivity and reduction of production costs upon manufacture of semiconductors, warpage of the package may further increase due to a difference of the shrinkage ratio among the chip, the epoxy resin composition, and the resin board. This may consequently cause various problems associated with defects occurring upon separation of the molded product into individual packages and defects occurring upon mounting of packages onto a printed circuit board (PCB). Additionally, with recently increased concerns and demands toward environmental friendliness, use of Pb-free solder balls for mounting of semiconductor packages was introduced, requiring relatively high melting point and reflow temperature, as compared to use of traditional Pb-containing solder balls. The high melting point and reflow temperature contribute to undesirable deterioration of reliability of packages. Therefore, there is a strong need for improvements of reflow-resistant properties against deterioration of the package reliability.

Additionally, in the manufacture of epoxy resins for encapsulation of semiconductor devices, a flame retardancy of UL-94 V-0 may be required. In order to obtain such a high level of flame retardancy, bromine epoxy or antimony trioxide ($Sb_2O_3$) as a flame retardant may be used in production of the semiconductor device-encapsulating epoxy resins. However, the semiconductor-encapsulating epoxy resins that secure the desired flame retardancy using this halogen-based flame retardant or antimony trioxide have been found to produce toxic carcinogenic substances, such as dioxin or difuran, upon incineration or fire. Further, the halogen-based flame retardants may produce problems in that gases such as HBr and HCl may be evolved upon combustion. Such gases are not only harmful to the human body, but also are primarily responsible for the corrosion of semiconductor chips or wires and lead frames. Accordingly, phosphorus-based flame retardants, such as phosphazene or phosphoric ester, or flame retardants such as nitrogen-containing resins, have been contemplated as a flame retardant. Unfortunately, the phosphorus-based flame retardants still have shortcomings in that phosphates or polyphosphates produced upon combination with moisture cause the corrosion of pads or chips in a long-term reliability test of semiconductors, thus resulting in deterioration of the reliability.

As described above, embodiments relate to an epoxy resin composition for encapsulating a semiconductor device and a semiconductor device using the same. In an implementation, the epoxy resin composition may include an epoxy resin, a curing agent, and one or more inorganic fillers. Prismatic cristobalite may be used as the inorganic filler, or as one of the inorganic fillers, and may account for about 1 to about 50% by weight of the total weight of the epoxy resin composition. The epoxy resin composition may be capable of alleviating or reducing warpage of a semiconductor device having an asymmetric one-sided encapsulation structure, while simultaneously providing excellent workability, flame retardancy, moldability, and reliability.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. An epoxy resin composition for encapsulating a semiconductor device, the epoxy resin composition comprising:
   an epoxy resin;
   a curing agent; and
   one or more inorganic fillers, the one or more inorganic fillers including prismatic cristobalite, the prismatic cristobalite being present in the epoxy resin composition in an amount of about 1 to about 50% by weight, based on the total weight of the epoxy resin composition, wherein the prismatic cristobalite is a mixture of:
   1 to 20% by weight of prismatic cristobalite having an average particle diameter of 0.1 to 3 μm, wherein prismatic cristobalite having an average particle diameter of 1 μm is present in an amount of 0.13 to 2.15% by weight, based on the total weight of the epoxy resin composition,
   30 to 90% by weight of prismatic cristobalite having an average particle diameter of 3 to 10 μm, wherein prismatic cristobalite having an average particle diameter of 5 μm is present in an amount of 1.93 to 32.25% by weight, based on the total weight of the epoxy resin composition, and
   5 to 60% by weight of prismatic cristobalite having an average particle diameter of 10 to 20 μm, wherein prismatic cristobalite having an average particle diameter of 18 μm is present in an amount of 0.52 to 8.60% by weight, based on the total weight of the epoxy resin composition.

2. The epoxy resin composition as claimed in claim 1, wherein the prismatic cristobalite has an average particle diameter of 0.1 to 35 μm, wherein a proportion of particles having a particle diameter ranging from 45 to 75 μm is 0.1 to 50% by weight, based on the total weight of the prismatic cristobalite.

3. The epoxy resin composition as claimed in claim 1, wherein the inorganic filler, including the prismatic cristobalite, is present in the epoxy resin composition in an amount of about 72 to about 95% by weight, based on the total weight of the epoxy resin composition.

4. The epoxy resin composition as claimed in claim 1, wherein the epoxy resin includes:
   an epoxy resin including phenolaralkyl structures and being represented by Formula 1:

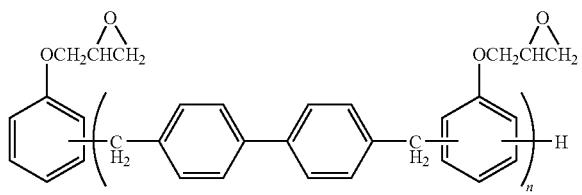

wherein n is an average of 1 to 7; or
   an epoxy resin including biphenyl structures and being represented by Formula 2:

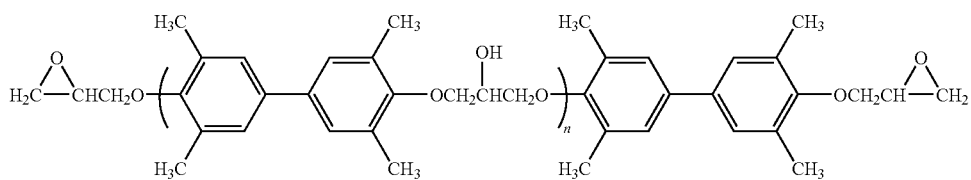

wherein n is an average of 0 to 7.

5. The epoxy resin composition as claimed in claim 4, wherein the epoxy resin includes the epoxy resin represented by Formula 1, and the epoxy resin represented by Formula 1 is present in the epoxy resin in an amount of about 10 to about 85% by weight, based on the total weight of the epoxy resin.

6. The epoxy resin composition as claimed in claim 1, wherein the epoxy resin is present in the epoxy resin composition in an amount of about 2 to about 15% by weight, based on the total weight of the epoxy resin composition.

7. The epoxy resin composition as claimed in claim 1, wherein the curing agent includes:
   a phenolic resin including phenolaralkyl structures and being represented by Formula 3:

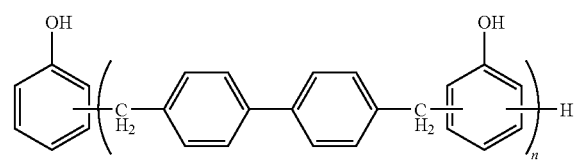

wherein n is an average of 1 to 7; or
   a phenolic resin including xylok structures and being represented by Formula 4:

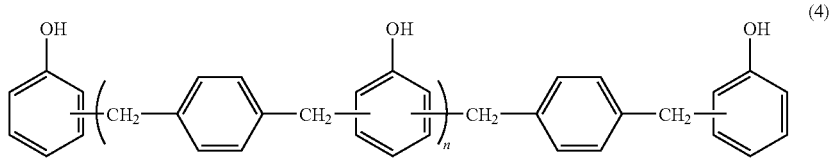

(4)

wherein n is an average of 0 to 7.

8. The epoxy resin composition as claimed in claim 7, wherein the curing agent includes the phenolic resin represented by Formula 3, and the phenolic resin represented by Formula 3 is present in the curing agent in an amount of about 10 to about 85% by weight, based on the total weight of the curing agent.

9. The epoxy resin composition as claimed in claim 1, wherein the curing agent is present in the epoxy resin composition in an amount of about 0.5 to about 12% by weight, based on the total weight of the epoxy resin composition.

10. The epoxy resin composition as claimed in claim 1, further comprising a curing accelerator, the curing accelerator being present in the epoxy resin composition in an amount of about 0.001 to about 1.5% by weight, based on the total weight of the epoxy resin composition.

11. A semiconductor device encapsulated by a final product which is prepared by mixing the composition of claim 1 using a Henshel or Redige mixer, melt-kneading the mixture in a roll mill or kneader, and cooling and pulverizing the mixture into a powder form.

12. The semiconductor device as claimed in claim 11, wherein the semiconductor device is encapsulated with the final powder product by low-pressure transfer molding, injection molding, or casting.

13. The semiconductor device as claimed in claim 12, wherein the semiconductor device includes a copper-based lead frame, an iron-based lead frame, a nickel-palladium-plated copper- or iron-based lead frame, or an organic-based laminate frame.

14. An electronic device, comprising;
a semiconductor device;
a semiconductor mounting board, the semiconductor device being surface mounted to the semiconductor mounting board; and
an encapsulant covering the semiconductor device on the semiconductor mounting board, the encapsulant including a cured mixture of an epoxy resin composition that includes an epoxy resin, a curing agent, and one or more inorganic fillers, the one or more inorganic fillers including prismatic cristobalite, the prismatic cristobalite being in the form of particles having a prismatic shape, the prismatic cristobalite being present in the epoxy resin composition in an amount of about 1 to about 50% by weight, based on the total weight of the epoxy resin composition, wherein the prismatic cristobalite is a mixture of:
1 to 20% by weight of prismatic cristobalite having an average particle diameter of 0.1 to 3 μm, wherein prismatic cristobalite having an average particle diameter of 1 μm is present in an amount 0.13 to 2.15% by weight, based on the total weight of the epoxy resin composition,
30 to 90% by weight of prismatic cristobalite having an average particle diameter of 3 to 10 μm, wherein prismatic cristobalite having an average particle diameter of 5 μm is present in an amount of 1.93 to 32.25% by weight, based on the total weight of the epoxy resin composition, and
5 to 60% by weight of prismatic cristobalite having an average particle diameter of 10 to 20 μm, wherein prismatic cristobalite having an average particle diameter of 18 μm is present in an amount of 0.52 to 8.60% by weight, based on the total weight of the epoxy resin composition.

15. The electronic device as claimed in claim 14, wherein the semiconductor device is mounted to the semiconductor mounting board by an array of electrical joints disposed underneath the semiconductor device.

16. The electronic device as claimed in claim 15, wherein the array of electrical joints is a ball grid array.

17. The electronic device as claimed in claim 15, further comprising an adhesive layer between the semiconductor device and the semiconductor mounting board, the adhesive layer having a different composition than that of the encapsulant.

18. The electronic device as claimed in claim 17, wherein the encapsulant is not disposed between the semiconductor device and the semiconductor mounting board.

19. A method of fabricating an electronic device that includes a semiconductor mounting board and a semiconductor device, the method comprising:
mounting the semiconductor device to the semiconductor mounting board; and
subsequently, encapsulating the semiconductor device using an epoxy resin composition, the epoxy resin composition including:
an epoxy resin;
a curing agent; and
one or more inorganic fillers, the one or more inorganic fillers including prismatic cristobalite, the prismatic cristobalite being in the form of particles having a prismatic shape, the prismatic cristobalite being present in the epoxy resin composition in an amount of about 1 to about 50% by weight, based on the total weight of the epoxy resin composition, wherein the prismatic cristobalite is a mixture of:
1 to 20% by weight of prismatic cristobalite having an average particle diameter of 0.1 to 3 μm, wherein prismatic cristobalite having an average particle diameter of 1μm is present in an amount of 0.13 to 2.15% by weight, based on the total weight of the epoxy resin composition,
30 to 90% by weight of prismatic cristobalite having an average particle diameter of 3 to 10 μm, wherein prismatic cristobalite having an average particle diameter of 5 μm is present in an amount of 1.93 to 32.25% by weight, based on the total weight of the epoxy resin composition, and
5 to 60% by weight of prismatic cristobalite having an average particle diameter of 10 to 20 μm, wherein prismatic cristobalite having an average particle diameter of 18 µm is present in an amount of 0.52 to 8.60% by weight, based on the total weight of the epoxy resin composition.

\* \* \* \* \*